(12) United States Patent
Archibald et al.

(10) Patent No.: US 7,832,925 B2
(45) Date of Patent: Nov. 16, 2010

(54) APPARATUS AND METHOD FOR SIMULATING HEATED AIRFLOW EXHAUST OF AN ELECTRONICS SUBSYSTEM, ELECTRONICS RACK OR ROW OF ELECTRONICS RACKS

(75) Inventors: Matthew R. Archibald, Morrisville, NC (US); Richard C. Chu, Hopewell Junction, NY (US); Hendrik F. Hamann, Yorktown Heights, NY (US); Madhusudan K. Iyengar, Poughkeepsie, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 11/950,758

(22) Filed: Dec. 5, 2007

(65) Prior Publication Data

US 2009/0150129 A1    Jun. 11, 2009

(51) Int. Cl.
G01K 1/12 (2006.01)
G01K 1/16 (2006.01)
G01K 13/10 (2006.01)
G01K 17/06 (2006.01)

(52) U.S. Cl. .......................... 374/29; 374/134; 374/135; 374/137; 374/141; 374/109; 374/44; 165/287; 702/130

(58) Field of Classification Search ............ 374/29–40, 374/100, 109–112, 115, 134, 135, 137, 43–44, 374/4, 5, 57, 163, 166, 141; 702/130–136
See application file for complete search history.

(56) References Cited

U.S. PATENT DOCUMENTS 4,473,110 A * 9/1984 Zawierucha ................. 165/133

(Continued)

OTHER PUBLICATIONS

Claassen et al., "Techniques for Analyzing Data Center Energy Utilization Practices", U.S. Appl. No. 11/750,325, filed May 17, 2007.

(Continued)

Primary Examiner—Gail Verbitsky
(74) Attorney, Agent, or Firm—Geraldine Monteleone, Esq.; Kevin P. Radigan, Esq.; Heslin Rothenberg Farley & Mesiti P.C.

(57) ABSTRACT

Apparatus and method are provided for facilitating simulation of heated airflow exhaust of an electronics subsystem, electronics rack or row of electronics racks. The apparatus includes a thermal simulator, which includes an air-moving device and a fluid-to-air heat exchanger. The air-moving device establishes airflow from an air inlet to air outlet side of the thermal simulator tailored to correlate to heated airflow exhaust of the electronics subsystem, rack or row of racks being simulated. The fluid-to-air heat exchanger heats airflow through the thermal simulator, with temperature of airflow exhausting from the simulator being tailored to correlate to temperature of the heated airflow exhaust of the electronics subsystem, rack or row of racks being simulated. The apparatus further includes a fluid distribution apparatus, which includes a fluid distribution unit disposed separate from the fluid simulator and providing hot fluid to the fluid-to-air heat exchanger of the thermal simulator.

15 Claims, 9 Drawing Sheets

U.S. PATENT DOCUMENTS

| | | | | |
|---|---|---|---|---|
| 4,681,744 | A * | 7/1987 | Weitman | 422/173 |
| 6,868,682 | B2 * | 3/2005 | Sharma et al. | 62/180 |
| 7,255,474 | B2 * | 8/2007 | Cong et al. | 374/131 |
| 7,311,264 | B2 * | 12/2007 | Franke et al. | 236/93 R |
| 7,698,114 | B2 * | 4/2010 | Hamann et al. | 703/5 |
| 7,739,073 | B2 * | 6/2010 | Hamann et al. | 702/130 |
| 2005/0236145 | A1 * | 10/2005 | Arai et al. | 165/133 |
| 2007/0032979 | A1 | 2/2007 | Hamann et al. | |
| 2007/0291817 | A1 * | 12/2007 | Bradicich et al. | 374/15 |
| 2008/0154534 | A1 * | 6/2008 | Bash et al. | 702/130 |
| 2008/0281551 | A1 * | 11/2008 | Hamann et al. | 702/132 |
| 2008/0300818 | A1 * | 12/2008 | Brey et al. | 702/130 |
| 2009/0207880 | A1 * | 8/2009 | Ahladas et al. | 374/141 |

OTHER PUBLICATIONS

Schmidt et al., "Best Practices for Data Center Thermal Management—Review of Literature", ASHRAE Transactions, vol. 113, Part 1, pp. 1-13, DA-07-022 (2006).

Schmidt et al., "Thermal Profile of a High-Density Data Center: Hot Spot Heat Fluxes of 512 W/ft2", ASHRAE Transactions, vol. 111, Part 2, pp. 1-13, DE-05-11-6 (2005).

Roger R. Schmidt, "Thermal Provide of a High-Density Data Center—Methodology to Thermally Characterize a Data Center", ASHRAE Transactions: Symposia, NA-04-4-2 (2004).

Schmidt et al., "Thermal Profile of World's 3rd Fastest Supercomputer—IBM's ASC Purple Cluster", ASHRAE Summer Annual Meeting (Jun. 21-25, 2006).

"High Performance Data Centers: A Design Guidelines Sourcebook", Pacific Gas & Electric (PG&E) White Paper, Pacific Gas & Electric Company, Berkeley National Laboratory for PG&E (2006).

* cited by examiner

APPARATUS AND METHOD FOR SIMULATING HEATED AIRFLOW EXHAUST OF AN ELECTRONICS SUBSYSTEM, ELECTRONICS RACK OR ROW OF ELECTRONICS RACKS

TECHNICAL FIELD

The present invention relates in general apparatuses and methods for facilitating thermal analysis of a data center, and more particularly, to apparatuses and methods for thermally simulating one or more respective electronics subsystems, electronics racks or rows of electronics racks to be disposed within a data center.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in recirculation problems with some fraction of the "hot" air exiting one rack unit being drawn into the air inlet of the same rack or a nearby rack. This recirculation flow is often extremely complex in nature, and can lead to significantly higher rack inlet temperatures than expected. This increase in cooling air temperature may result in components exceeding their allowable operating temperature or in a reduction in long term reliability of the components.

Addressing thermal imbalances within a data center is often an expensive and time consuming operation. Therefore, there is a need in the art for apparatuses and methods which facilitate thermal and energy based design, analysis and optimization of electronics equipment of a data center.

SUMMARY OF THE INVENTION

The shortcomings of the prior art are overcome and additional advantages are provided through the provision of an apparatus comprising at least one thermal simulator and a fluid distribution apparatus. The at least one thermal simulator simulates heated airflow exhaust of a respective electronics subsystem, electronics rack or row of electronics racks. Each thermal simulator includes at least one air-moving device and at least one fluid-to-air heat exchanger. The at least one air-moving device establishes airflow from an air inlet side to an air outlet side of the thermal simulator, wherein established airflow exhausting from the thermal simulator is tailored to correlate to heated airflow exhaust of the respective electronics subsystem, electronics rack or row of electronics racks being simulated. The at least one fluid-to-air heat exchanger heats airflow through the thermal simulator, wherein temperature of established airflow exhausting from the air outlet side of the thermal simulator is tailored to correlate to a temperature of the heated airflow exhaust of the respective electronics subsystem, electronics rack or row of electronics racks being simulated. The fluid distribution apparatus includes at least one fluid distribution unit. The at least one fluid distribution unit provides hot fluid to the at least one fluid-to-air heat exchanger of the at least one thermal simulator for facilitating simulation of heated airflow exhaust of the respective electronics subsystem, electronics rack or row of electronics racks.

In another aspect, an apparatus is provided which includes a fluid distribution apparatus and a hybrid, dual-function fluid distribution unit. The fluid distribution apparatus includes a fluid supply header and a fluid return header. The fluid supply header provides fluid in parallel to multiple thermal simulators or multiple electronics racks, and the fluid return header receives fluid in parallel from the multiple thermal simulators or the multiple electronics racks. The hybrid, dual-function fluid distribution unit is coupled to the fluid supply header and to the fluid return header, and includes a hot fluid distribution sub-unit and a coolant distribution sub-unit. When in a heating mode, the hot fluid distribution sub-unit provides hot fluid via the fluid supply header and fluid return header to the multiple thermal simulators for facilitating simulation of heated airflow exhaust of respective electronics racks being simulated. When in a cooling mode, the coolant distribution sub-unit provides chilled fluid to the multiple electronics racks to facilitate cooling thereof. The hybrid, dual-function fluid distribution unit further includes at least one bypass valve for facilitating switching of fluid flow between the hot fluid distribution sub-unit and the coolant distribution sub-unit.

In a further aspect, a method of supplying fluid to a data center is provided. The method includes: obtaining a hybrid, dual-function fluid distribution unit comprising a hot fluid distribution sub-unit and a coolant distribution sub-unit; and employing the hybrid, dual-function fluid distribution unit in a heating mode or a cooling mode, wherein when employed in the heating mode, hot fluid is provided by the hot fluid distribution sub-unit of the hybrid, dual-function fluid distribution unit to at least one thermal simulator for facilitating simulation of heated airflow exhaust of a respective electronics subsystem, electronics rack or row of electronics racks, and when employed in the cooling mode, the coolant distribution sub-unit provides chilled fluid to facilitate cooling of at least one electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack. As used herein, a "thermal simulator" lacks the electronics subsystem or electronics subsystems of (for example) the electronics rack to be simulated.

In addition, "data center" refers to a computer installation to contain one or more electronics racks to be cooled. As a specific example, a data center may be designed to contain one or more rows of rack-mounted computing units, such as server units. Further, as used herein, "fluid-to-air heat exchanger" means any heat exchange mechanism characterized as described herein through which fluid can circulate; and includes, one or more discrete fluid-to-air heat exchangers coupled either in-series or in parallel. A fluid-to-air heat exchanger may comprise, for example, one or more fluid flow paths, formed of thermally conductive tubing (such as copper or other tubing) in thermal communication with (in one example) a plurality of thermally conductive fins. Size, configuration and construction of the fluid-to-air heat exchanger can vary without departing from the scope of the invention disclosed herein.

One example of the hot fluid discussed below is water. However, the concepts disclosed herein are readily adapted to use with other types of fluid. For example, a dielectric liquid, a fluorocarbon liquid, a fluoroinert liquid, a liquid metal, a brine, steam, flue gas, combustion-related gas, or other similar fluid may be employed, while still maintaining the advantages and unique features of the present invention.

Reference is made below to the drawings, which are not drawn to scale for reasons of understanding, wherein the same reference numbers used throughout different figures designate the same or similar components.

Figure 1:
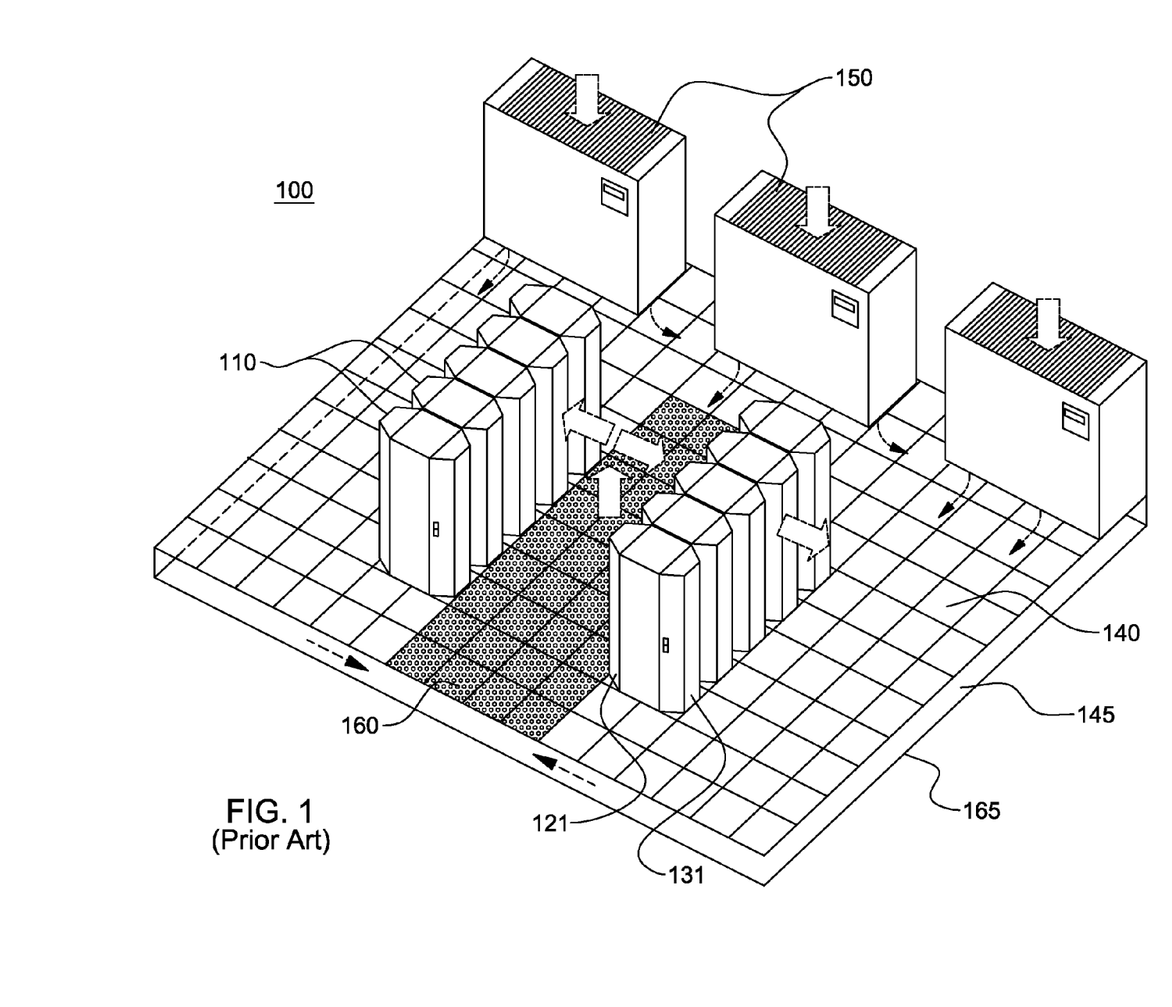
FIG. 1 depicts one embodiment of a conventional raised floor layout of an air-cooled data center.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air often comprises (in part) exhausted air from the "hot" air aisles of the data center disposed adjacent to air outlet sides of the electronics racks 110.

Limiting factors for cooling an air-cooled data center, such as data center 100 in FIG. 1, are related to the maximum chilled airflow rate that can be supplied from a single perforated tile, the maximum cooling capability of the air-conditioning units within the data center, and the hot air recirculation phenomenon that is common in such data centers. Hot air recirculation occurs when the total flow rate of supplied chilled air in front of an electronics rack is less than the total airflow rate through the electronics rack, leading to the hot exhaust from one electronics rack being drawn into the intake of the same or another electronics rack, thus resulting in potentially unacceptably high air inlet temperatures. This can impact the reliability and performance of the electronics within the rack, and lead to device failure in extreme cases.

Typically, data center thermal issues are addressed using one of two approaches. In the first approach, a human expert and some degree of trial and error are employed to make changes in the data center by changing layout of, for example, the perforated tiles, the electronics racks, the air-conditioning units, room geometry (ceiling, walls, partitions, ducts, types of tiles), or by changing the operating point of the air-conditioning units (air or liquid flow rates, set point temperatures). Alternatively, a computer-based technique to model the data center may be employed to simulate several "what if?" scenarios, followed by a plan for making actual changes in the data center layout to improve cooling of the electronics racks.

There are two dominant problems with computer-based modeling techniques. The first is the difficulty in obtaining accurate model input information. While it is difficult to obtain accurate model input information of server racks, it is even more difficult to obtain accurate input information before installation. Such input can include the detailed physical description of the above and under-floor parts of a data center, rack power and rack flow information, tile airflow rates, and tile air temperature (which can vary), to name a few. Computer-based models also require a number of assumptions. For example, computer-based models usually assume that there is no draft or air blowing across the room from various poorly sealed boundaries of the room, and they assume that there is no escape route for air in the under-floor plenum perimeter where some cold air could, in reality, "disappear". Also, electronics racks are typically represented as perfectly rectangular units with uniform airflow and uniform heat dissipation profiles, which is often not the case.

Another problem with computer-based modeling techniques is the inherent inaccuracies arising from physics-based assumptions that are made to construct the model. These assumptions are embedded in the solver engine of the modeling tool. One example might be the use of a certain turbulence model to characterize the flow physics which would bring with it several assumptions. While such a turbulence model might be applied globally, it might only work well for certain spatial areas of the data center. Another example could be the assumption that natural convection (or buoyancy-driven flow) contributes very little to the temperature gradients in the room. Yet another assumption could be the use of fluid properties which do not vary with temperature. Such assumptions can contribute to differences between model results in air temperatures versus actual measurement data, even when the model inputs are very accurate and detailed.

Therefore, actual installation and a certain degree of trial and error are believed necessary to attain an optimized data center layout. After installation, however, it is often difficult and costly to change one or more design parameters of the data center, such as the position and number of air-conditioning units, or the layout of the electronics racks. Thus, presented herein are apparatuses and methods which address this problem of trial and error installation optimization.

Figure 2:
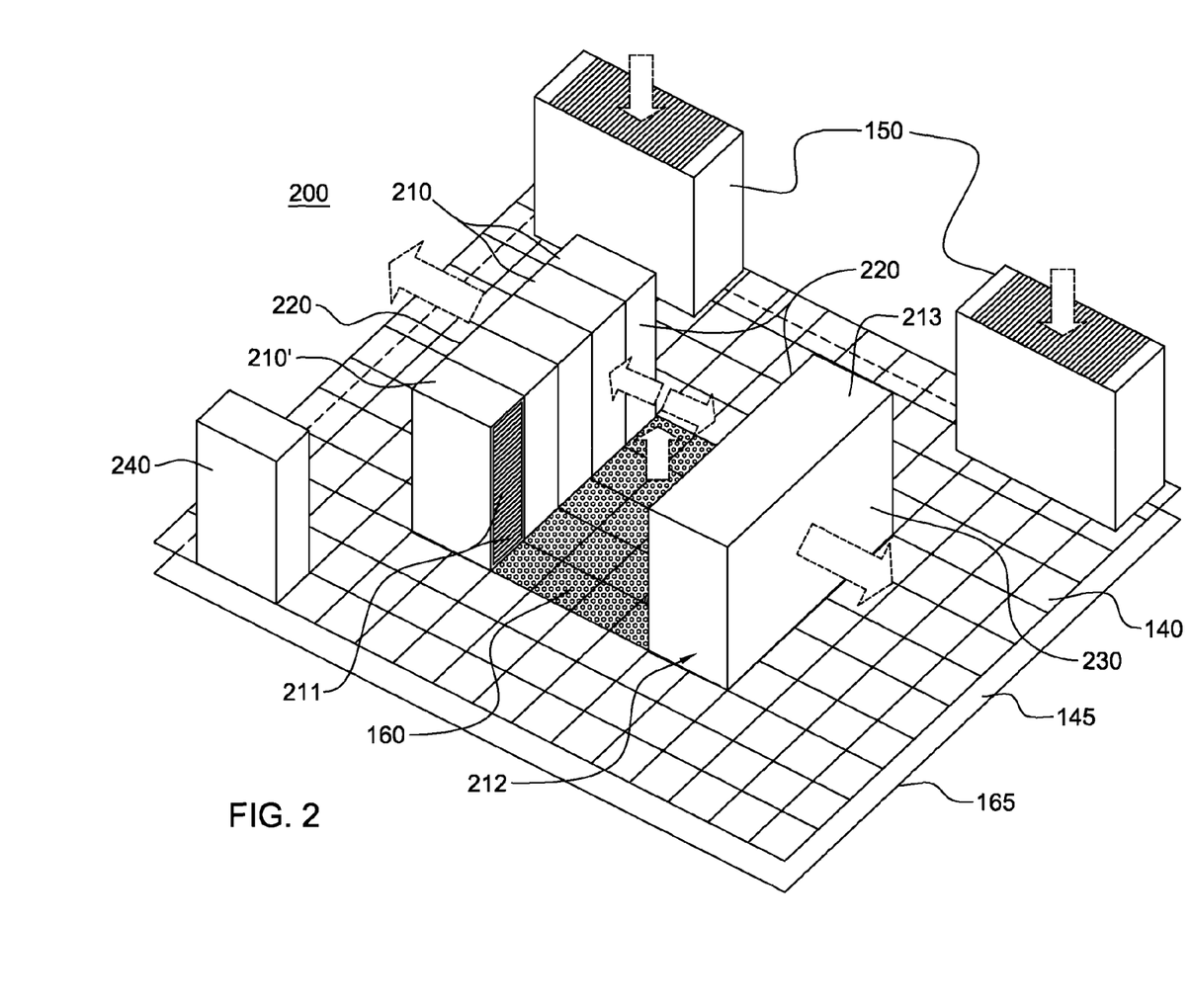
FIG. 2 depicts one embodiment of a data center layout with a plurality of thermal simulators, a hot fluid distribution unit and multiple air-conditioning units, in accordance with an aspect of the present invention.

FIG. 2 illustrates one embodiment of a data center layout, generally denoted 200, comprising a plurality of thermal simulators (in accordance with an aspect of the present invention). These thermal simulators include rack thermal simulators 210, electronics subsystem (or node level) thermal simulators 211 (disposed, for example, in rack thermal simulator 210'), and row thermal simulator 212, which simulates exhausted airflow from an entire row of electronics racks. In one embodiment, a one to one correlation is assumed between the location of the thermal simulators in FIG. 2 and the location of electronics racks 110 in data center layout 100 of FIG. 1. In this regard, note that row thermal simulator 212 simulates an entire row of electronics racks illustrated in FIG. 1. That is, row thermal simulator 212 is constructed to simulate heated airflow exhaust from multiple electronics racks disposed in a row.

In one embodiment, row thermal simulator 212 includes an outer housing 213 and at least one vertical partition (not shown) therein defining different airflow columns through housing 213. Each airflow column essentially simulates airflow through a respective electronics rack of the row of electronics racks. As will be understood from the following discussion, row thermal simulator 212 further includes one or more air-moving devices for establishing airflow from an air inlet side to an air outlet side thereof, wherein the established airflow exhausting from the airflow columns is tailored to correlate to heated airflow exhaust of the respective electronics racks in the row. The row thermal simulator further includes one or more fluid-to-air heat exchangers (such as the fluid-to-air heat exchangers discussed hereinbelow). The fluid-to-air heat exchanger(s) heat airflow exhausting from the row thermal simulator to tailor temperature of the airflow exhausted from the airflow columns thereof to correlate to temperature of heated airflow exhaust from the respective electronics racks in the row of electronics racks being simulated.

In general, each thermal simulator is constructed to simulate a rate of airflow exhausting from a respective electronics subsystem, electronics rack or row of electronics racks, as well as the thermal characteristics of the airflow. As described further below, one or more hot fluid distribution units 240 provide hot fluid to the fluid-to-air heat exchangers of the thermal simulators, for example, via appropriate fluid supply and return headers disposed, in one embodiment, between raised floor 140 and base floor 165 of the room. Chilled air enters the computer room via floor vents 160 from supply air plenum 145, and is taken in through the air inlet sides 220 of the respective thermal simulators and expelled through the air outlet sides 230 thereof. Conditioned and cooled air is supplied to plenum 145 by one or more air-conditioning units 150, also disposed within the data center. Room air is taken into each air-conditioning unit 150 near an upper portion thereof. This room air comprises in part exhausted air from the "hot" air aisle of the data center at the air outlet sides of the thermal simulators.

Figures 3, 3A:
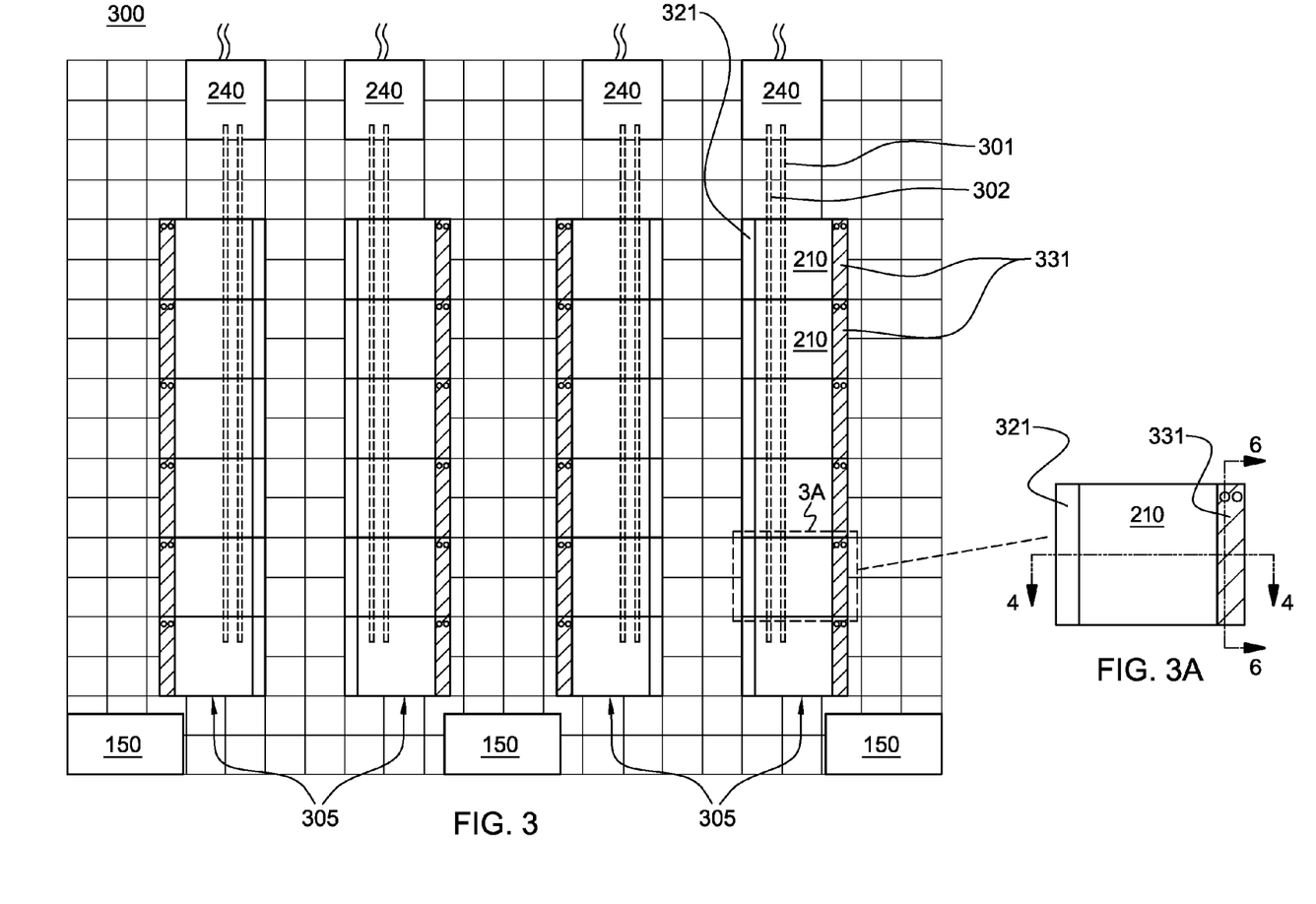
FIG. 3 depicts an alternate embodiment of a data center layout with a plurality of rack thermal simulators, multiple fluid distribution units, and multiple air-conditioning units, in accordance with an aspect of the present invention.
FIG. 3A is an enlarged view of one rack thermal simulator of the plurality of rack thermal simulators of FIG. 3, in accordance with an aspect of the present invention.

FIG. 3 depicts an alternate data center layout, generally denoted 300, containing a plurality of rack thermal simulators 210 (in accordance with an aspect of the present invention). In this embodiment, multiple rows 305 of rack thermal simulators 210 are provided, with each row having a respective hot fluid distribution unit 240 connected thereto via a fluid supply header 301 and a fluid return header 302 running, in one embodiment, under the raised floor of the data center. Multiple computer room air-conditioning units 150 are also shown disposed within data center layout 300.

FIG. 3A depicts an enlarged view of one rack thermal simulator 210. As shown, rack thermal simulator 210 includes an inlet door 321 and an outlet door 331. In one embodiment, inlet door 321 is hingedly connected along one edge to rack thermal simulator 210 at the air inlet side thereof, and outlet door 331 is hingedly connected along one edge to rack thermal simulator 210 at the air outlet side thereof.

Figure 4:
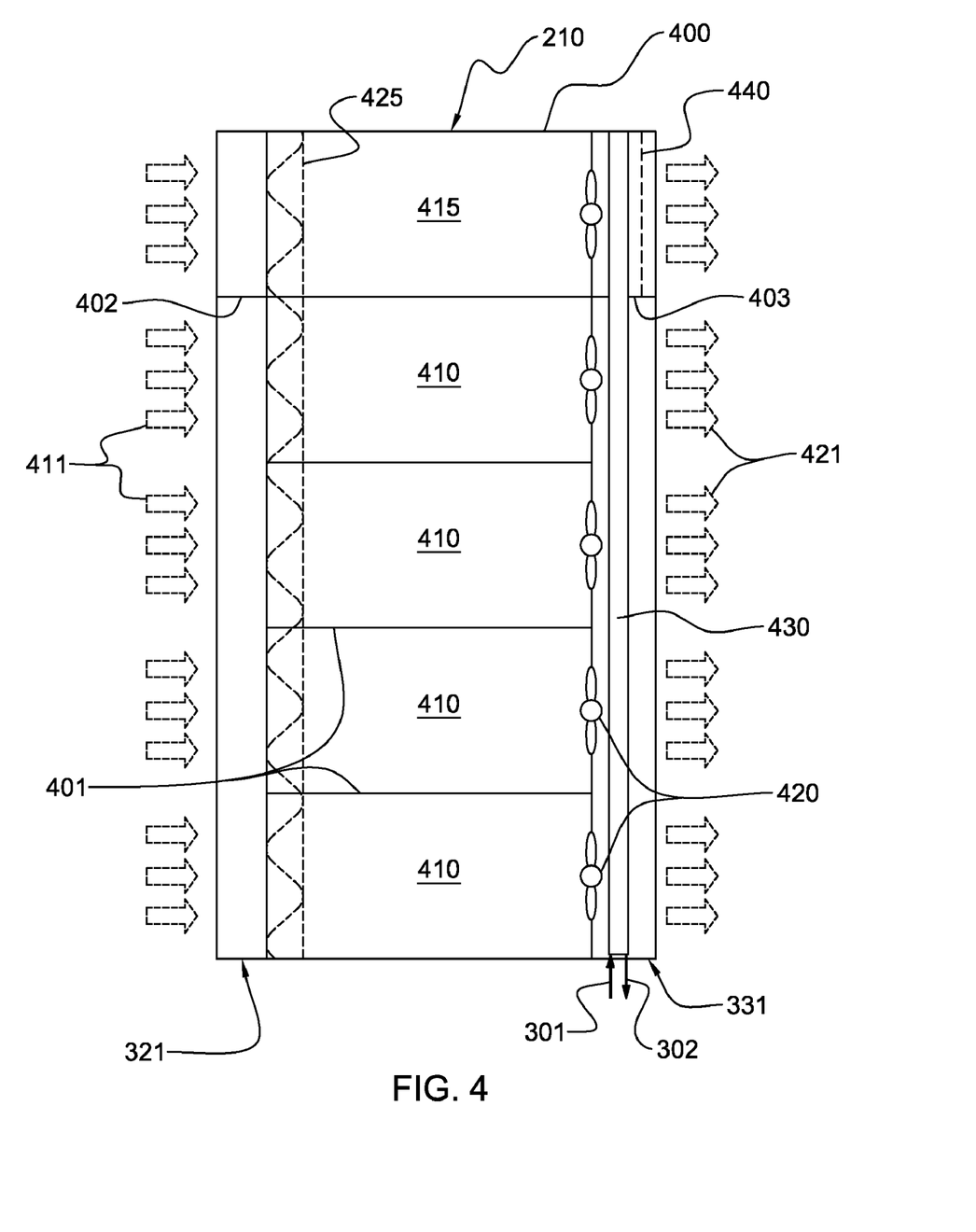
FIG. 4 is a cross-sectional elevational view of the rack thermal simulator of FIG. 3A, taken along line 4-4, in accordance with an aspect of the present invention.

FIG. 4 is a cross-sectional elevational view of the rack thermal simulator 210 of FIG. 3A, taken along line 4-4. As shown, rack thermal simulator 210 includes a rack frame 400 with multiple, horizontally-oriented flow partition plates 401 dividing the rack frame into multiple subsections 410, 415. Each subsection is sized to correspond to an electronics subsystem of the respective electronics rack being thermally simulated. In this example, one subsection 415 is isolated from the other subsections 410, with airflow into and from subsection 415 being isolated from airflow into and from the remaining subsections 410. This is accomplished using a front flow partitioning plate 402 and a back flow partitioning plate 403 disposed or extending into inlet door 321 and outlet door 331, respectively.

Multiple air-moving devices 420 draw external air 411 through inlet door 321 and the respective subsections 410, 415 of rack frame 400 for expelling out through outlet door 331 as airflow exhaust 421. In one example, each subsection 410, 415 includes one or more air-moving devices 420, and the air-moving devices are separately controllable so that airflow through the respective subsections can be tailored to simulate airflow through the corresponding electronics subsystems of the respective electronics rack being simulated. Each subsection may include an airflow impedance filter 425 tailored to establish an airflow impedance through rack thermal simulator 210 correlated to the airflow impedance through the respective electronics rack being simulated. More particularly, by providing horizontally-oriented flow partitioning plates 401, 402 & 403, airflow impedance filters 425, and air-moving devices 420, airflow through the respective subsections of rack thermal simulator 210 can be tailored to mirror airflow through the corresponding electronics subsystems of the electronics rack being simulated.

One or more flow profile plates 440 may also be used in rack thermal simulator 210 to configure the airflow exhaust 421 from one or more subsections 415, 410 of the simulator. This allows a more realistic simulation of the airflow exhaust from the corresponding electronics subsystems of the electronics rack being simulated.

Figure 5:
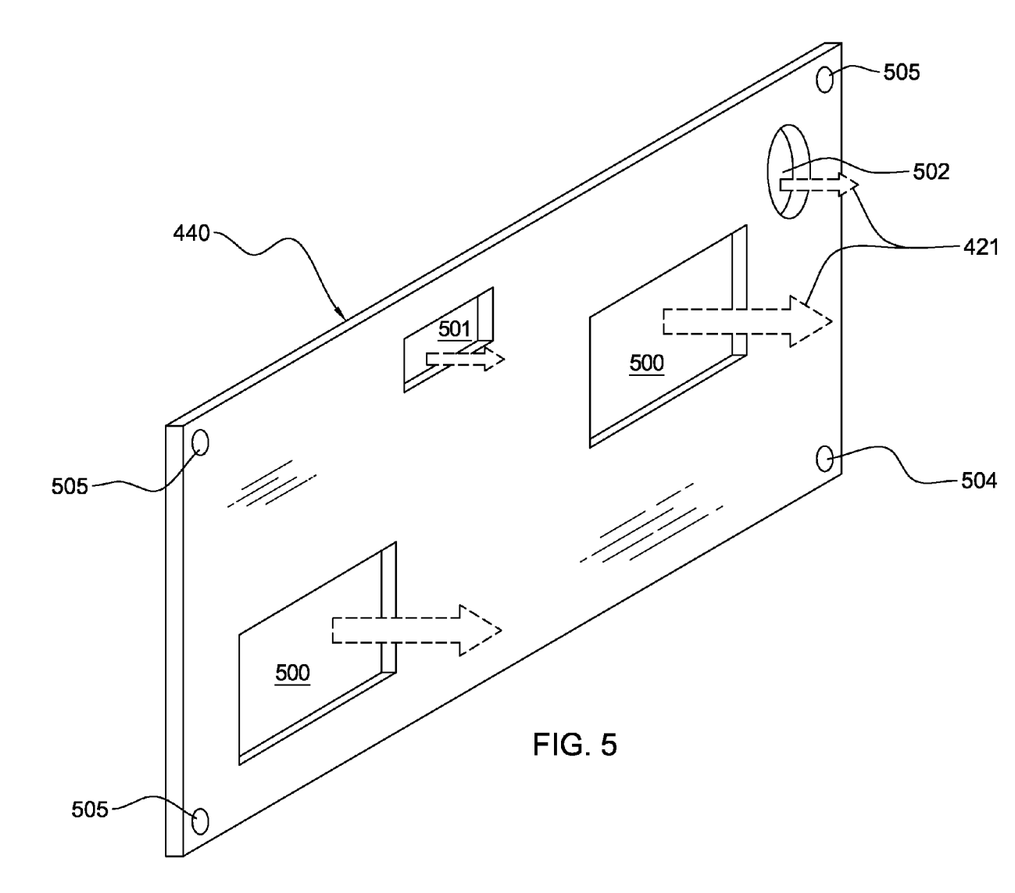
FIG. 5 is an isometric view of one embodiment of a flow profile plate used in the rack thermal simulator of FIG. 4, in accordance with an aspect of the present invention.

FIG. 5 depicts one embodiment of flow profile plate 440 wherein a plurality of airflow openings include rectangular openings 500, 501, and circular opening 502. Further, openings 505 facilitating securing of the plate to the thermal simulator, for example, using bolts (not shown). The different configurations and sizes to the openings allow tailoring of the airflow exhaust 421 profile. The particular flow profile plate 440 which may be desirable thus depends upon a characterization of the airflow exhaust from the corresponding electronics subsystem or electronics rack being simulated. Although shown as tailoring airflow exhaust from a particular subsection, it should be noted that each subsection within rack thermal simulator 210 could have associated therewith a respective flow profile plate, or a single flow profile plate could be employed across multiple subsections of rack thermal simulator 210.

As shown in FIG. 4, rack thermal simulator 210 further includes a fluid-to-air heat exchanger 430 disposed, for example, within outlet door 331, for heating air exhausting from the rack thermal simulator. Air exhausting from rack thermal simulator 210 is heated by the fluid-to-air heat exchanger to a temperature which is tailored to simulate a temperature of heated airflow exhaust of the respective electronics rack being simulated. Hot fluid is provided to fluid-to-air heat exchanger 430 via fluid supply header 301 and fluid return header 302.

Figure 6:
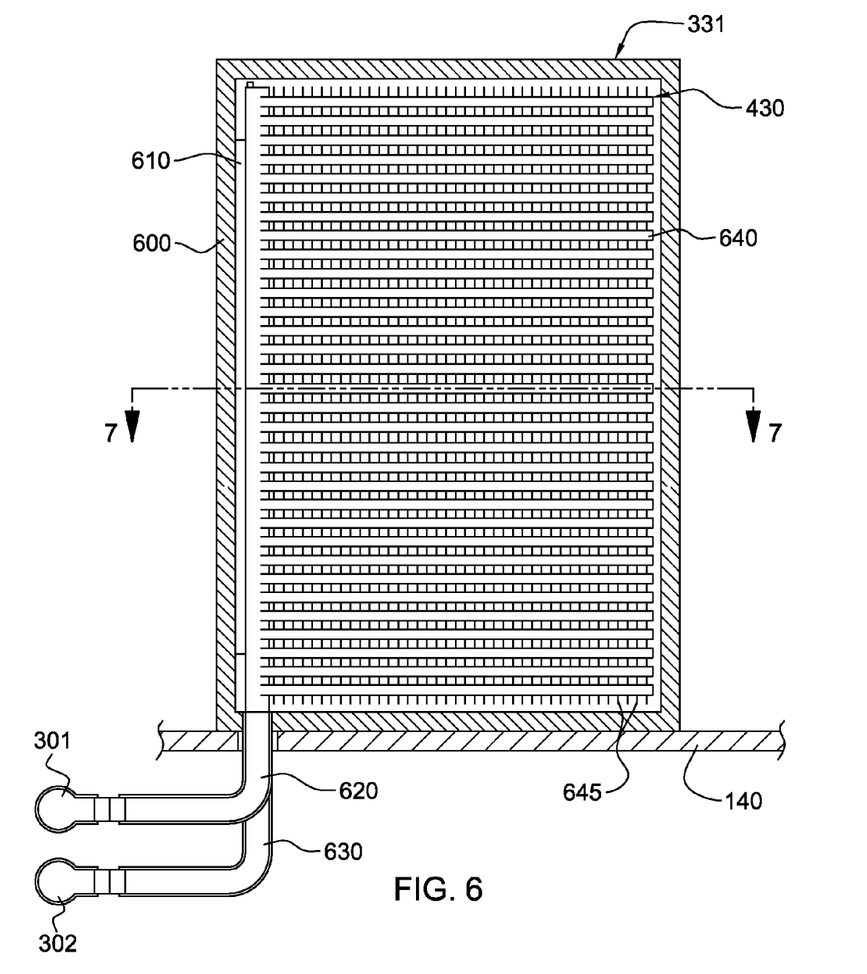
FIG. 6 is a cross-sectional elevational view of the rack thermal simulator of FIG. 3A, taken along line 6-6, in accordance with an aspect of the present invention.
Figure 7:
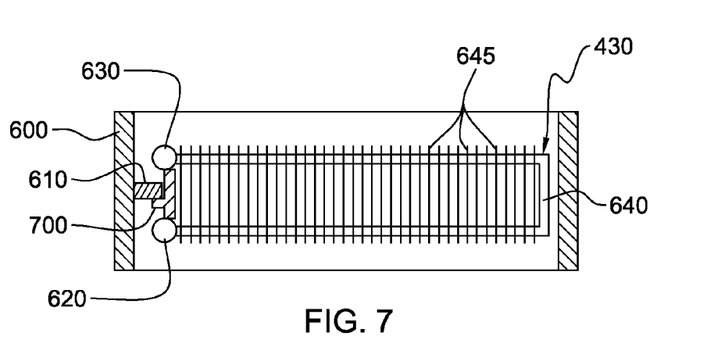
FIG. 7 is a cross-sectional plan view of the structure of FIG. 6, taken along line 7-7, in accordance with an aspect of the present invention.

FIG. 6 is a cross-sectional elevational view of the structure of FIG. 3A, along line 6-6 through outlet door 331 and fluid-to-air heat exchanger 430 supported thereby, while FIG. 7 is a cross-sectional plan view of the structure illustrating fluid inlet and outlet plenums 620, 630, respectively, of the fluid-to-air heat exchanger. Referring to both figures collectively, outlet door 331 is illustrated above raised floor 140 and includes an outlet door frame 600 which supports a rigid flap 610, attached (for example) by welding, brazing or soldering, to a plate 700 secured between fluid inlet plenum 620 and fluid outlet plenum 630. In one embodiment, fluid inlet plenum 620 receives (via appropriate connection to fluid supply header 301) hot fluid from a respective hot fluid distribution unit 240 (see FIG. 3). Fluid outlet plenum 630 exhausts lukewarm fluid to fluid return header 302 for return to the respective hot fluid distribution unit 240 (FIG. 3).

In the embodiment illustrated in FIGS. 6 & 7, fluid-to-air heat exchanger 430 includes a plurality of horizontally-oriented heat exchange tube sections 640. These heat exchange tube sections 640 each comprise a fluid channel having an inlet and an outlet, with each fluid channel inlet being coupled to fluid inlet plenum 620, and each fluid outlet channel being coupled to fluid outlet plenum 630. A plurality of fins 645, which in one embodiment are vertically-oriented, rectangular fins, are attached to the horizontally-orientated heat exchange tube sections 640 to facilitate transfer of heat from hot fluid passing through the fluid channels to air flowing across the fluid-to-air heat exchanger, thereby causing heated air to be exhausted from the heat exchanger, and hence from the rack thermal simulator. Again, the rack thermal simulator is tailored so that heated air exhausting therefrom simulates (i.e., correlates to the amount and temperature of) hot air exhausting from the respective electronics rack being simulated. For example, laboratory testing of the respective electronics rack is performed to obtain operational flow rate and temperature data on the heated air exhausting from the electronics rack, which is then used to tailor the rack thermal simulator to simulate the operating electronics rack. Further, although described herein with reference to simulating an operating electronics rack, the thermal simulator could alternatively be constructed to simulate an electronics subsystem, or a row of electronics racks, as noted above in connection with FIG. 2.

By way of further explanation, the airflow rate generated by each air-moving device of the rack thermal simulator illustrated in FIGS. 3A-7 can be manipulated (in one embodiment) via an associated variable frequency drive device connected to the air-moving device. Based on actual knowledge of airflow rate for the electronics rack being simulated, the airflow rate through the rack thermal simulator can be manually or automatically set to a specific value. Manual setting of airflow rate can take place using an appropriate manual interface to a control unit (not shown) coupled to the rack thermal simulator and the variable frequency drive devices. Power dissipation of each rack thermal simulator could also be adjusted via the control unit by manipulating the rate of hot fluid flow supplied to the rack thermal simulator. Such a valve-based mechanism would reside, in one embodiment, with the under-floor headers of the fluid distribution apparatus. The hot fluid temperature leaving the hot fluid distribution unit and its total flow rate is assumed to be controlled by the hot fluid distribution unit. In the embodiment of FIGS. 3-7, where one hot fluid distribution unit provides hot fluid to six rack thermal simulators, using parallel plumbing, each rack thermal simulator receives the same fluid flow rate at the same temperature. By using valves at the rack thermal simulator or at the fluid distribution apparatus, flow rate of hot fluid to specific rack thermal simulators can be adjusted. The use of series-parallel piping arrangements can yield different temperatures to different rack thermal simulators. A larger fluid flow rate or higher temperature of fluid entering the heat exchanger of one rack thermal simulator results in a higher heat dissipation rate, and thus, greater power consumption being simulated.

In general, the monolithic apparatuses disclosed herein are advantageously used in installations which possess a degree of homogeneity. By employing a single fluid distribution unit hot fluid can be provided to multiple thermal simulators, therefore reducing the energy which would otherwise be expended in heating the fluid. Further, the rack thermal simulators disclosed herein can be readily converted from a simulation mode to actual electronics racks containing one or more electronics subsystems to be cooled.

Figure 8:
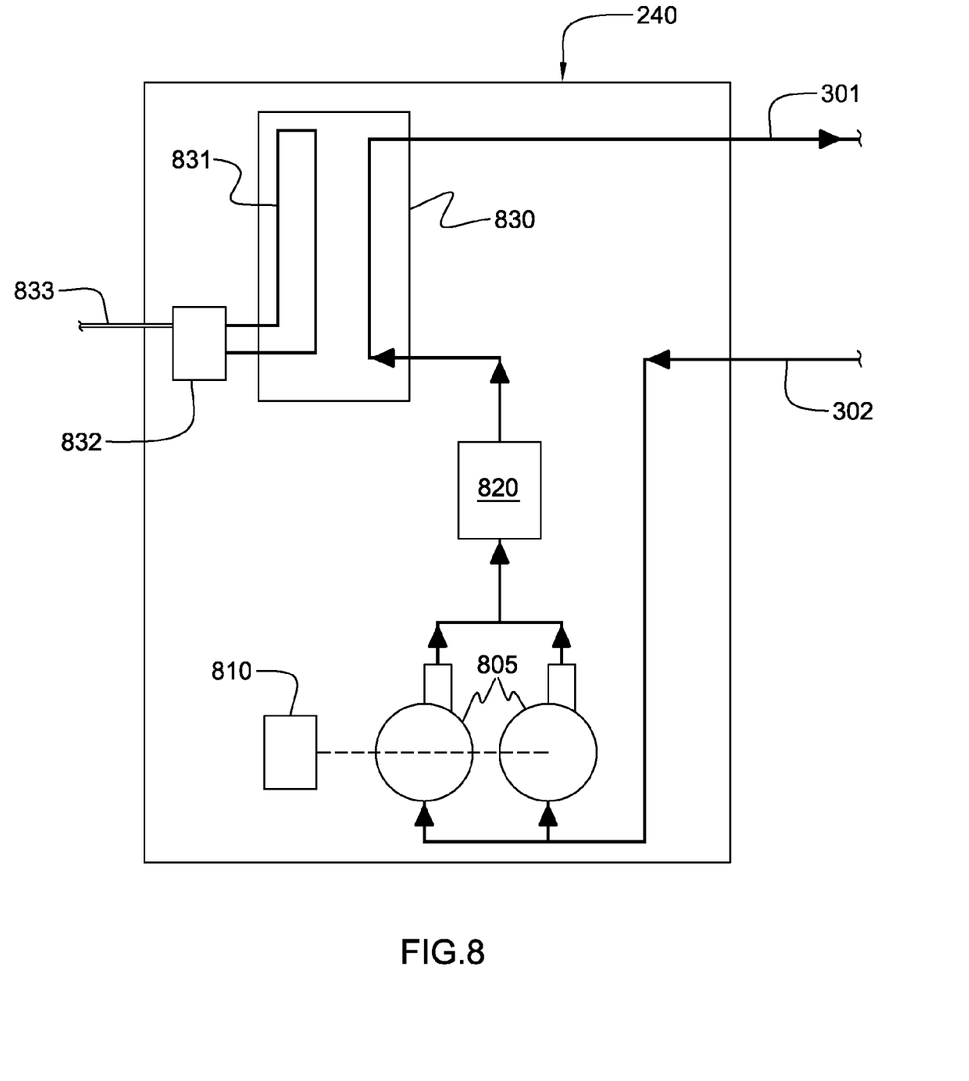
FIG. 8 is a schematic of one embodiment of a hot fluid distribution unit, in accordance with an aspect of the present invention.

FIG. 8 depicts one embodiment of a hot fluid distribution unit 240, in accordance with an aspect of the present invention. As shown, hot fluid distribution unit 240 is coupled to a respective fluid supply header 301 and to a respective fluid return header 302 for supplying hot fluid to multiple thermal simulators disposed within a data center layout, such as depicted in FIG. 3. Fluid is pumped employing a redundant pump assembly 805 into and through a fluid reservoir 820. A variable frequency drive device 810 is coupled to redundant pump assembly 805 to control the flow rate of fluid being pumped through hot fluid distribution unit 240. By varying the flow rate, it is possible to affect change in the amount of heat being dissipated by the respective fluid-to-air heat exchangers of the thermal simulators, and hence, temperature of the airflow exhausting from the thermal simulators. A fluid heater 830 includes (in one embodiment) an electrical resistance heater coil 831, and a power supply 832, which is electrically powered 833, and which sets the total power being dissipated by electrical resistance heater coil 831, and hence, sets the temperature of the hot fluid exiting fluid heater 830 for distribution to the thermal simulators.

Figure 9:
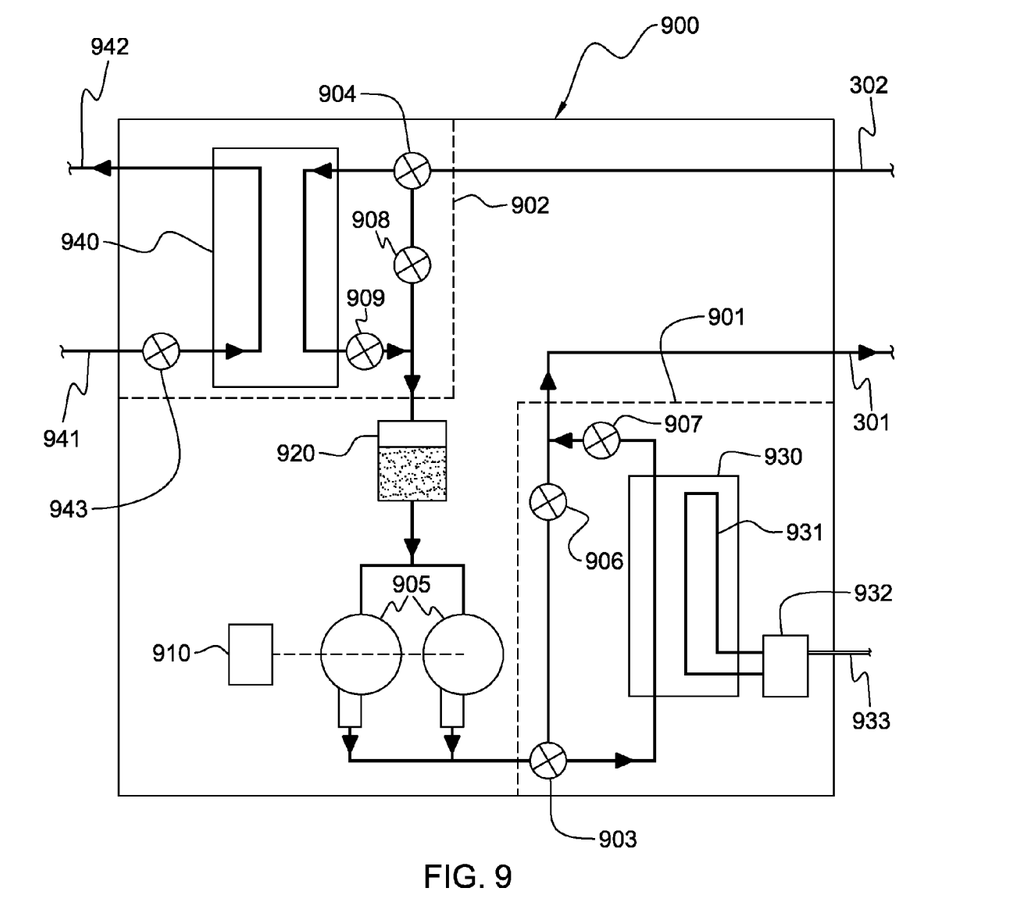
FIG. 9 is a schematic of one embodiment of a hybrid, dual-function fluid distribution unit, in accordance with an aspect of the present invention.

FIG. 9 depicts one embodiment of a hybrid, dual-function fluid distribution unit 900, which is an alternative apparatus to the hot fluid distribution unit depicted in FIG. 8. As shown in FIG. 9, the hybrid, dual-function fluid distribution unit 900 includes a hot fluid distribution sub-unit 901 and a coolant distribution sub-unit 902. Hot fluid distribution sub-unit 901 and coolant distribution sub-unit 902 share a redundant pump assembly 905 and a fluid reservoir 920. In the embodiment illustrated, redundant pump assembly 905 is controlled by a variable frequency drive device 910 that allows variation in flow rate of hot fluid or chilled fluid, depending upon whether the hybrid, dual-function fluid distribution unit is in heating mode or cooling mode.

In heating mode, a bypass valve 904 is actuated to direct fluid from fluid return header 302 through a one-way valve 908 into fluid reservoir 920, while a second bypass valve 903 directs fluid from redundant pump assembly 905 into fluid heater 930 of hot fluid distribution sub-unit 901. Fluid heater 930 includes electrical resistance heater coils 931, which are powered by a variable power supply 932, which itself is electrically powered 933. Hot fluid exits fluid heater 930, passes through a one-way valve 907, for output via fluid supply header 301 to one or more thermal simulators, such as described above. One-way valve 906 prevents hot fluid from circulating back to bypass valve 903. Similarly, in the heating mode, one-way valve 909 prevents fluid passing through one-way valve 908 from circulating into a liquid-to-liquid heat exchanger 940 of coolant distribution sub-unit 902.

In cooling mode, bypass valve 904 is actuated to direct fluid from fluid return header 302 into liquid-to-liquid heat exchanger 940. In this mode, heat is removed from the fluid, and transferred, for example, to facility coolant passing through a facility coolant supply line 941 and facility coolant return line 942. A control valve 943 is provided within facility coolant supply line 941 to control the amount of facility coolant passing through liquid-to-liquid heat exchanger 940, and hence, the amount of cooling applied to the fluid being circulated back to the electronics rack. The chilled fluid exits liquid-to-liquid heat exchanger 940 through one-way valve 909, and is directed into fluid reservoir 920 via one-way valve 908. From fluid reservoir 920, the fluid is pumped though bypass valve 903 and one-way valve 906 for output to fluid supply header 301.

Figure 10:
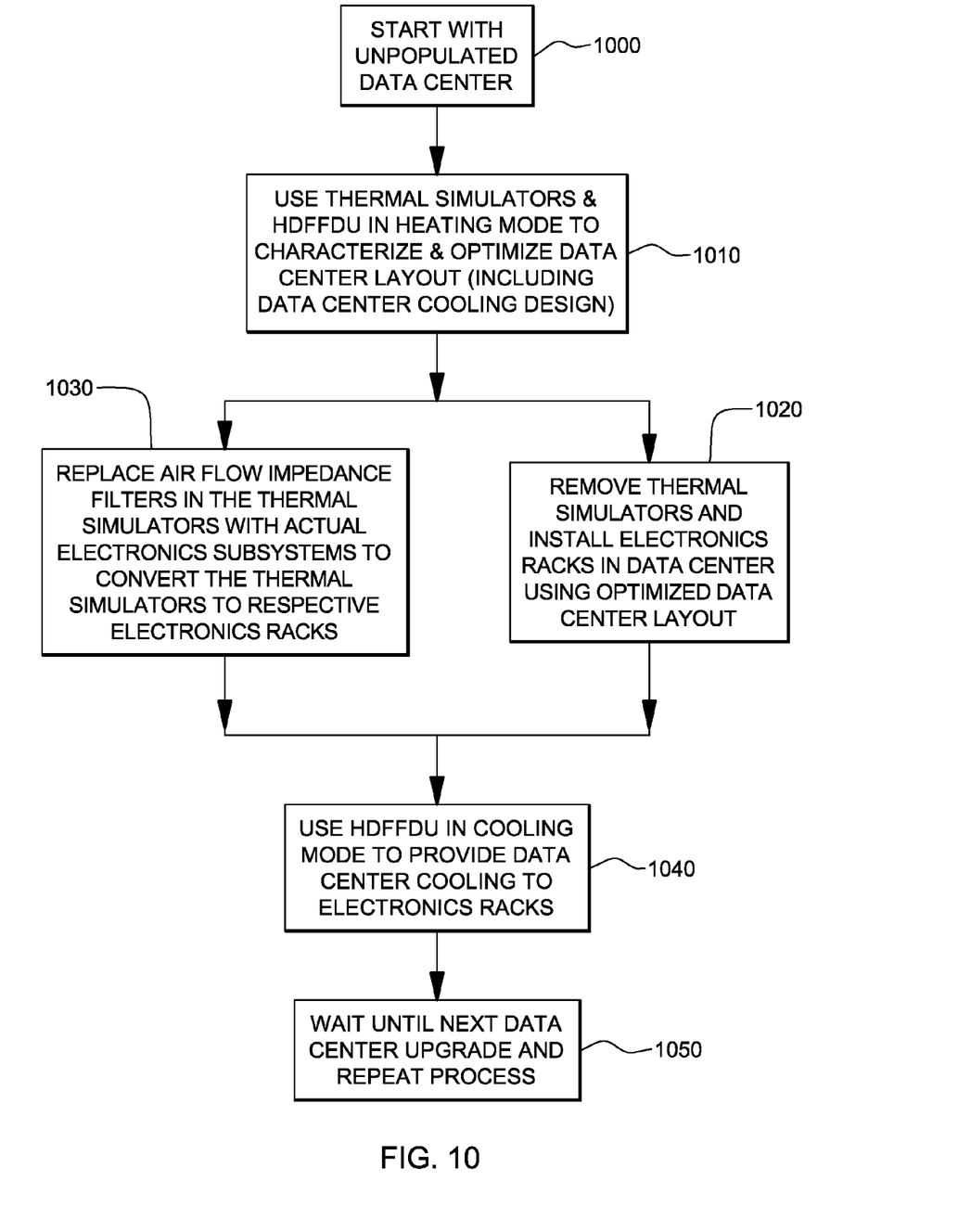
FIG. 10 is a flowchart of one embodiment of a process for using a plurality of rack thermal simulators and a hybrid, dual-function fluid distribution unit in a data center, and thereafter for using the hybrid, dual-function fluid distribution unit to facilitate cooling of a plurality of electronics racks in the data center, in accordance with an aspect of the present invention.

FIG. 10 is a flowchart of one process for analyzing a data center layout, and subsequently cooling electronics racks, using a hybrid, dual-function fluid distribution unit, such as depicted in FIG. 9. The process begins with an unpopulated data center 1000, which is to contain electronics racks pursuant to a simulated data center layout. Thermal simulators, such as the rack thermal simulators described herein, are employed along with the hybrid, dual-function fluid distribution unit in heating mode to characterize and optimize a data center layout (including a data center cooling design) 1010. After the data center layout has been optimized, the thermal simulators are removed from the data center and the respective electronics racks are installed in the data center using the optimized data center layout 1020. Alternatively, the rack frames of the thermal simulators could be employed as rack frames for the respective electronics racks by replacing the airflow impedance filters of the thermal simulators with actual electronics subsystems, thereby converting the thermal simulators into the respective electronics racks 1030. The hybrid, dual-function fluid distribution unit (HDFFDU) is then employed in cooling mode to provide data center cooling to the electronics racks 1040, and processing waits until a next data center upgrade, for which the simulation process is repeated to optimize the new data center layout.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus comprising:
   at least one thermal simulator, each thermal simulator simulating heated airflow exhaust of a respective electronics subsystem, electronics rack or row of electronics racks, and each thermal simulator comprising:
      at least one air-moving device for establishing airflow from an air inlet side to an air outlet side of the thermal simulator, wherein established airflow exhausting from the thermal simulator is tailored to correlate to heated airflow exhaust of the respective electronics subsystem, electronics rack or row of electronics racks being simulated; and
      at least one fluid-to-air heat exchanger, the at least one fluid-to-air heat exchanger heating airflow through the thermal simulator, wherein temperature of established airflow exhausting from the air outlet side of the thermal simulator is tailored to correlate to a temperature of the heated airflow exhaust of the respective electronics subsystem, electronics rack or row of electronics racks being simulated; and
   a fluid distribution apparatus comprising at least one fluid distribution unit disposed separate from the at least one thermal simulator, the at least one fluid distribution unit providing hot fluid to the at least one fluid-to-air heat exchanger of the at least one thermal simulator.

2. The apparatus of claim 1, wherein the at least one air-moving device of each thermal simulator further establishes an inlet airflow into the thermal simulator correlated to an inlet airflow to the respective electronics subsystem, electronics rack or row of electronics racks being simulated.

3. The apparatus of claim 1, wherein the at least one thermal simulator comprises at least one row thermal simulator, each row thermal simulator simulating heated airflow exhaust from multiple electronics racks disposed in a row, and each row thermal simulator further comprising a housing comprising at least one vertical partition, the at least one vertical partition defining different airflow columns through the housing, each airflow column being related in size to a size of a respective electronics rack of the multiple electronics racks in the row being simulated, and each row thermal simulator comprising:

at least one air-moving device disposed within the housing, the at least one air-moving device establishing airflow from an air inlet side to an air outlet side of the housing, wherein established airflow exhausting from the airflow columns is tailored to correlate to heated airflow exhaust from the row of multiple electronics racks being simulated; and at least one fluid-to-air heat exchanger associated with the housing, the at least one fluid-to-air heat exchanger heating airflow through each airflow column, wherein temperature of airflow exhausted from the air outlet side of the airflow columns is tailored to correlate to a temperature of heated airflow exhaust from the row of multiple electronics racks being simulated.

4. The apparatus of claim 1, wherein the at least one thermal simulator further comprises at least one airflow impedance filter configured to tailor an airflow impedance from the air inlet side to the air outlet side of the at least one thermal simulator to correlate to an airflow impedance through the respective electronics subsystem, electronics rack or row of electronics racks being simulated.

5. The apparatus of claim 1, wherein the at least one thermal simulator is configured to simulate heated airflow exhaust from a respective electronics rack, and wherein each thermal simulator further comprises a rack frame sized to a respective electronics rack being simulated, and the at least one fluid-to-air heat exchanger of each thermal simulator is mounted to the rack frame thereof at the air inlet side or the air outlet side.

6. The apparatus of claim 5, wherein each thermal simulator further comprises at least one airflow partitioning plate disposed within the rack frame dividing the rack frame into multiple subsections, each subsection of the multiple subsections corresponding in size to a size of a respective electronics subsystem of the electronics rack being simulated.

7. The apparatus of claim 6, wherein each thermal simulator comprises multiple horizontally-oriented, airflow partitioning plates, an inlet door hingedly mounted along one edge to the rack frame at the air inlet side, and an outlet door hingedly mounted along one edge to the rack frame at the air outlet side, and wherein the multiple horizontally-oriented, airflow partitioning plates isolate airflow through at least one subsection of the multiple subsections from airflow through at least one other subsection of the multiple subsections.

8. The apparatus of claim 7, wherein at least one airflow partitioning plate of the multiple horizontally-oriented, airflow partitioning plates extends into at least one of the inlet door or the outlet door to facilitate isolation of airflow through the at least one subsection of the multiple subsections from airflow through the at least one other subsection of the multiple subsections.

9. The apparatus of claim 6, wherein each thermal simulator comprises multiple air-moving devices, and wherein each air-moving device of the multiple air-moving devices is disposed to facilitate establishing airflow through a respective subsection of the multiple subsections.

10. The apparatus of claim 1, wherein the at least one thermal simulator further comprises at least one flow profile plate, the at least one flow profile plate fluidically tailoring airflow exhausting from the at least one thermal simulator to fluidically simulate an airflow exhaust pattern of the respective electronics subsystem, electronics rack or row of electronics racks being simulated.

11. The apparatus of claim 10, wherein the at least one flow profile plate comprises multiple openings, at least two openings of the multiple openings being at least one of differently configured or differently sized.

12. The apparatus of claim 1, further comprising multiple thermal simulators for simulating heated airflow exhaust from multiple respective electronics racks, and wherein the at least one fluid distribution unit comprises a hot fluid distribution unit disposed separate from the multiple thermal simulators, the hot fluid distribution unit providing hot fluid in parallel to the multiple thermal simulators, and wherein the hot fluid distribution unit comprises a fluid heater facilitating providing of the hot fluid to the multiple thermal simulators.

13. The apparatus of claim 12, wherein the hot fluid distribution unit comprises a redundant pumping assembly, a variable frequency drive device controlling the redundant pumping assembly, and hence fluid flow rate through the hot fluid distribution unit, a fluid reservoir, and the fluid heater, wherein the fluid heater comprises at least one electrical resistance coil for heating fluid being pumped from the hot fluid distribution unit.

14. The apparatus of claim 1, further comprising multiple thermal simulators simulating heated airflow exhaust from multiple electronics racks, and wherein the fluid distribution apparatus comprises at least one fluid supply header and at least one fluid return header, and wherein the at least one fluid distribution unit comprises a hybrid, dual-function fluid distribution unit, the hybrid, dual-function fluid distribution unit comprising a heating mode and a cooling mode, and wherein the hybrid, dual-function fluid distribution unit further comprises a hot fluid distribution sub-unit, a coolant distribution sub-unit, and multiple bypass valves for facilitating switching fluid between the hot fluid distribution sub-unit and the coolant distribution sub-unit, wherein when in the heating mode, the hot fluid distribution sub-unit provides hot fluid via the at least one fluid supply header and the at least one fluid return header to multiple thermal simulators for simulating heated airflow exhaust of multiple electronics racks, and when in the cooling mode, the coolant distribution sub-unit provides coolant via the at least one fluid supply header and the at least one fluid return header to multiple electronics racks for facilitating cooling thereof.

15. The apparatus of claim 14, wherein the hybrid, dual-function fluid distribution unit further comprises a pump assembly and a fluid reservoir, wherein the pump assembly and the fluid reservoir are shared by the hot fluid distribution sub-unit and the coolant distribution sub-unit.

* * * * *